(12) United States Patent
Manz

(10) Patent No.: US 8,361,230 B2
(45) Date of Patent: Jan. 29, 2013

(54) MAGNETIC MASK HOLDER

(75) Inventor: Dieter Manz, Schlaitdorf (DE)

(73) Assignee: Applied Materials GmbH & Co. KG, Alzenau (DE)

(*) Notice: Subject to any disclaimer, the term of this patent is extended or adjusted under 35 U.S.C. 154(b) by 434 days.

(21) Appl. No.: 11/406,832

(22) Filed: Apr. 19, 2006

(65) Prior Publication Data

US 2007/0006807 A1   Jan. 11, 2007

(30) Foreign Application Priority Data

Apr. 20, 2005   (EP) .................................... 05008662

(51) Int. Cl.
*C23C 16/00* (2006.01)
*C23F 1/00* (2006.01)
*H01L 21/306* (2006.01)
*B05C 11/11* (2006.01)

(52) U.S. Cl. ........ 118/721; 118/720; 118/726; 118/504; 156/345.19; 156/345.3

(58) Field of Classification Search .................. 118/720, 118/721, 726, 213, 301, 406, 504; 156/345.19, 156/345.3

See application file for complete search history.

(56) References Cited

U.S. PATENT DOCUMENTS

| | | | |
|---|---|---|---|
| 5,474,611 A | 12/1995 | Murayama et al. | |
| 5,662,785 A | 9/1997 | Schertler | |
| 6,955,726 B2* | 10/2005 | Kang et al. .................... | 118/720 |
| 2002/0031420 A1 | 3/2002 | Kroeker | |
| 2004/0018305 A1 | 1/2004 | Pagano et al. | |
| 2004/0026634 A1 | 2/2004 | Utsumi et al. | |
| 2007/0009671 A1 | 1/2007 | Manz | |

FOREIGN PATENT DOCUMENTS

| | | |
|---|---|---|
| CN | 1426118 A | 6/2003 |
| DE | 12 36 900 B | 3/1967 |
| DE | 4235678 C1 | 5/1994 |
| DE | 29707686 U1 | 6/1997 |
| DE | 101 32 348 A1 | 2/2003 |
| EP | 1202329 A2 | 5/2002 |
| JP | 10-317139 * | 12/1998 |
| JP | 2001019422 A | 1/2001 |
| JP | 2001049422 A | 2/2001 |
| JP | 2002075638 A | 3/2002 |
| JP | 2002105622 A2 | 4/2002 |

(Continued)

OTHER PUBLICATIONS

JP_Eng_11-158605, Takeshi, dt. Jun. 15, 1999.*

(Continued)

*Primary Examiner* — Rakesh Dhingra
(74) *Attorney, Agent, or Firm* — Kilpatrick Townsend & Stockton LLP

(57) ABSTRACT

Aspects of the present invention are directed to a mask holder for especially large-surface substrates, especially for the micro-structuring of organic electroluminescent materials (OLED) for the production of OLED screens, displays and the like by means of vacuum-coating processes, with a substrate carrier for receiving the substrate during coating processes, with the substrate carrier comprising one or more magnets and the mask features a frame of magnetic material, such that the frame of the mask is held by means of the magnets of the substrate carrier relative to the substrate to be coated.

10 Claims, 4 Drawing Sheets

FOREIGN PATENT DOCUMENTS

| | | | |
|---|---|---|---|
| JP | 3592689 B2 | | 11/2002 |
| JP | 2002367781 A | | 12/2002 |
| JP | 2003-027212 | | 1/2003 |
| JP | 2003-187973 | * | 7/2003 |
| JP | 2004-079349 | | 3/2004 |
| JP | 2004152704 A2 | | 5/2004 |
| JP | 2004-211133 | * | 7/2004 |
| JP | 2004208955 A | | 7/2004 |
| JP | 2004-259598 | * | 9/2004 |
| JP | 2005077258 A | | 3/2005 |
| JP | 2006028583 A | | 2/2006 |
| JP | 2006188731 A | | 7/2006 |
| TW | 578183 B | | 3/2004 |
| WO | WO 03004719 A1 | | 1/2003 |
| WO | WO 03/043067 A1 | | 5/2003 |

OTHER PUBLICATIONS

JP_Eng_2004-047238, Bin et al, dt. Feb. 12, 2004.*
JP_Eng_2004-259598, Kenji et al, dt. Sep. 16, 2004.*
JP 10317139_Eng_Feb. 12, 1998.*
JP 2003187973_Eng_Jul. 4, 2003.*
JP 2004-079349_Eng_Mar. 11, 2004.*
Patent Abstracts of Japan, JP 10152776 (Toray Ind. Inc.), Jun. 9, 1998, 1 pg.
Patent Abstracts of Japan, JP 11158605 (Anelva Corp.), Jun. 15, 1999, 1 pg.
Patent Abstracts of Japan, JP 2003187973 (ANS Inc.), Jul. 4, 2003, 1 pg.
Patent Abstracts of Japan, JP 2004047238 (ANS Inc.), Feb. 12, 2004, 1 pg.
European Search Report for EP 05008662 mailed Sep. 15, 2005.
European Search Report for EP 05008663 mailed Sep. 19, 2005.
European Search Report for EP 05008669 mailed Sep. 29, 2005.

* cited by examiner

MAGNETIC MASK HOLDER

RELATED APPLICATION

This application relates to U.S. patent application Ser. No. 11/407,343 entitled PROCESS AND DEVICE FOR POSITIONING THE MASK, by Dieter Manz, filed on even date herewith, and U.S. patent application Ser. No. 11/406,806 entitled CONTINUOUS OLED COATING MACHINE, by Dieter Manz, Marcus Bender, Uwe Hoffmann, Dieter Haas, Ulrich Englert, Heino Lehr and Achim Gttrke, filed on even date herewith. Both of these related applications are incorporated herein by reference.

BACKGROUND OF INVENTION

The present invention relates to a mask holder for especially large-surface substrates, especially for the microstructuring of organic electroluminescent materials (OLED) on preferably large-surface substrates, especially screens, displays and the like by means of vacuum-coating processes.

In the production of so-called OLED displays or screens, which utilize the light-emitting properties of organic, electroluminescent materials (OLED), it is necessary to apply organic, electroluminescent materials with a corresponding micro-structure on a transparent substrate, such as glass, such that the electroluminescent structures may be actuated by corresponding electrode layers and stimulated to emit light.

The micro-structured, organic, electroluminescent materials are usually applied by means of vacuum-coating processes, with the microstructures usually generated by corresponding shadow masks. These masks need to be placed on the substrates in a suitable manner, to be transported along with them through the corresponding coating chambers, and then removed again from them in order that, following possible cleaning, they may be reused.

On account of the small dimensions of the micro-structuring, very accurate positioning of the masks is essential, especially when so-called RGB displays are manufactured in which pixel areas for red, green and blue light have to be generated in close proximity to each other for chromatic presentation on the display. In addition, the vacuum-coating processes require a high degree of purity, such that it must be ensured that the handling devices for the masks do not generate any unnecessary particles.

A magnetic holding device for foil masks is described in DE 297 07 686 U 1. In the described holding device a foil mask is arranged on a substrate carrier by means of positioning pins on which said mask, in turn, the substrate to be coated lies. Above the substrate is an arrangement of magnets that serves to press the full surface of the ferromagnetic mask against the substrate, which is provided between mask and magnet arrangement. In such an arrangement for a mask holder, the mechanical attachment of the mask to the substrate carrier promotes the generation of undesirable particles and, moreover, such an arrangement is unfavourable for simple, quick and precise arrangement and removal of the mask from the substrate.

Further, EP 1 202 329 A 2 refers to a mask arrangement in which a mask is pressed across its full surface against the substrate by means of an arrangement of magnets behind the substrate carrier. The masks described therein may feature a peripheral frame by means of which the mask is laterally clamped in order to impart a certain degree of stability to the thin foil from which the mask is usually made. Although such magnetic attraction of the mask against the substrate enables full contact to be obtained between the mask and the substrate and hence freedom from blisters, and sharp coating edges, such an arrangement is not optimal for rapid, precise handling with regard to mask changing, especially under vacuum conditions. Moreover, the magnets merely serve the purpose of creating full-surface, blister-free contact between the mask and the substrate, but not that of holding in a dynamic system in which the substrate on the substrate carrier is moved with the mask through the coating area.

SUMMARY OF INVENTION

At least one aspect of the invention is directed to a mask holder for dynamic vacuum-coating processes, especially during the in-line production of OLED screens or displays, that avoids the disadvantages of the prior art and especially guarantees a precise, rapid and simple possibility of mask changing, and a secure and reliable arrangement of the mask at the (dynamic) substrate moved during coating. Especially, the corresponding devices for mask changing are to be easy to manufacture and simple to operate.

In a first aspect of the invention, a substrate carrier comprises one or more magnets and is consequently capable of directly holding the mask during transport through the coating machine, such that the mask is held directly or in relation to this substrate, which is arranged between the substrate carrier and mask.

By means of this arrangement, the substrate is treated carefully for one thing since the holding function for the mask transfers directly to the substrate carrier. For another, on account of the magnetic holder, simple handling and secure holding of the mask during transport through the vacuum-coating machine are assured. By virtue of the predetermined arrangement of the magnets on the substrate carrier and of the use of several localized magnets opposite large-surface magnets, simple interaction with a corresponding handling device, which may preferably feature switchable electromagnets, is assured.

The magnets of the mask holder on the substrate carrier may be both permanent magnets and electromagnets.

The magnets are preferably spaced equidistantly from each other around the periphery of the substrate-receiver area at the substrate carrier, where, for example, they may form a ring shape, a rectangular shape or a polygonal closed band. Especially, such an arrangement assures uniform holding of the mask. Preferably, the magnets are arranged at the rear of the substrate carrier, that is, opposite the substrate via a mask-holding plate or a corresponding frame, which is arranged detachably at the substrate-receiver plate. In a preferred embodiment, spacers are provided between the substrate-receiver plate and the mask-holding plate, such that the magnets are received or held between the substrate-receiver plate and the mask-holding plate.

In accordance with one aspect of the invention, the mask is formed in accordance with the arrangement of the magnets on the substrate carrier such that it at least features a magnetic edge or frame, with the term edge being used if the mask is formed in one piece, while the term frame is used if the mask consists of multiple pieces overall and especially if frame and mask are formed from two different parts. In this way, it is possible to also use non-magnetic mask materials that can then be incorporated into corresponding magnetic frame arrangements.

When a frame is used, it is additionally possible to clamp the thin foil-like masks along the foil plane as well such that they feature greater stability perpendicular to the foil plane.

Further, the use of a frame or the arrangement of the holding magnets relative to the edge of the mask facilitates stable attachment of them by correspondingly high magnetic forces.

In addition to the magnetic holder, further holding possibilities may be provided by way of supplement, in which, for example, the magnets of the substrate carrier can engage positively with corresponding recesses on the frame of the mask.

The placement surface or contact surface between substrate carrier or substrate and mask or frame is preferably formed such that the full surface of the mask contacts the substrate.

Additionally, even more magnets may be provided in or at the substrate carrier in the actual mask area in order that, especially in the case of magnetic masks, full-surface pressing of the mask against the substrate may be assured.

Further advantages, characteristics and features of the present invention are apparent from the following detailed description of an embodiment using the enclosed drawings. The purely schematic diagrams show the following:

DETAILED DESCRIPTION

Figure 1:
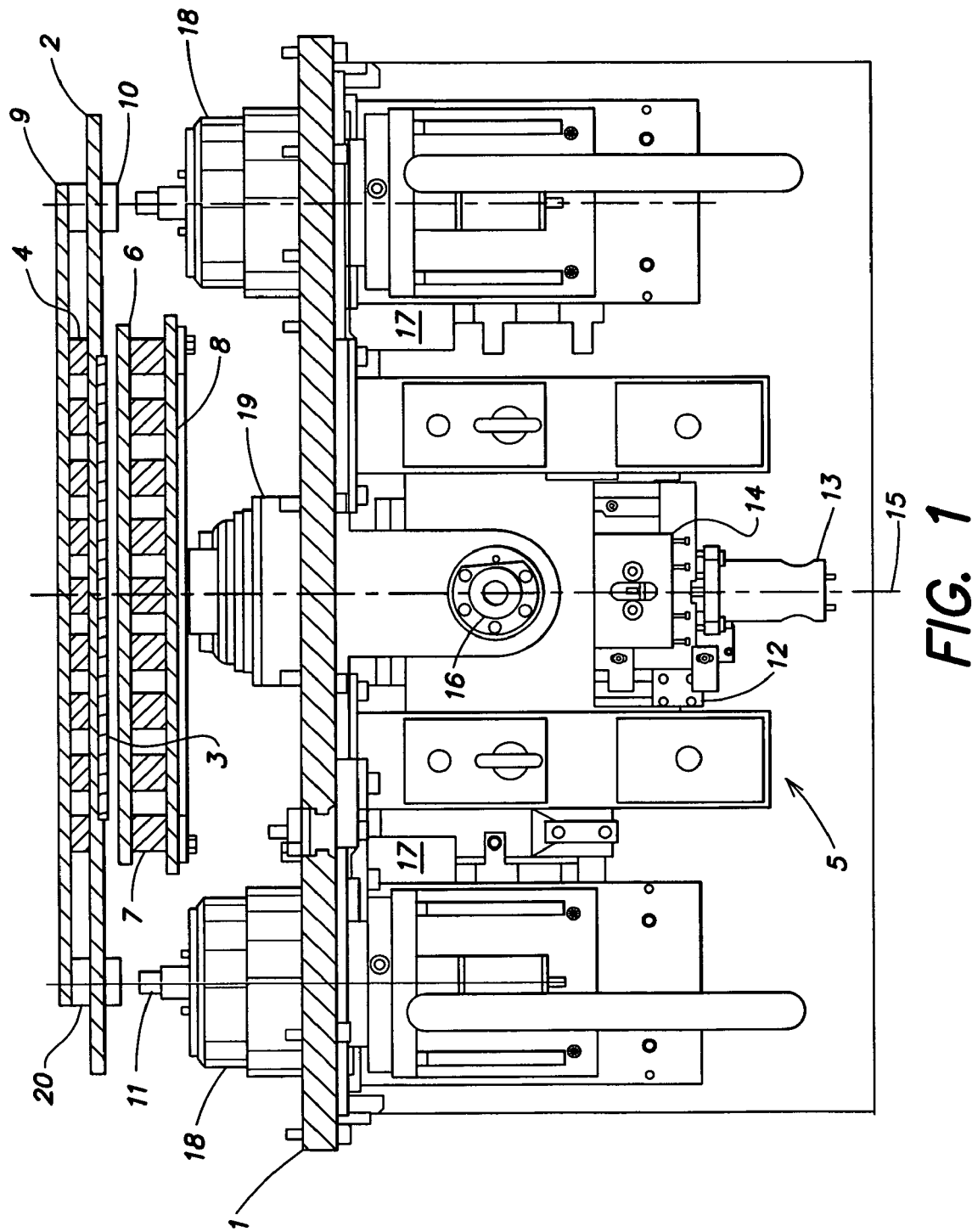
FIG. 1 shows a side view of a mask-application station, with the mask in the raised state.

FIG. 1 is a lateral view and partial cross-sectional view of a mask-application station for a vacuum chamber of a vacuum-coating machine, especially for the continuous (in-line) coating of transparent substrates with organic, electroluminescent materials for the production of OLED displays or screens.

FIG. 1 shows a cross-section through a chamber wall or a mounting plate 1, which can be inserted into the chamber wall, whereby, in the vacuum chamber, i.e. above the mounting plate 1 of FIG. 1, a substrate carrier 2 is shown with a substrate 3 arranged on it, which can be transported through the vacuum chamber by means of transport or conveyor devices not shown.

In the state shown in FIG. 1, the substrate is located above a mask-application station with mask-positioning device 5, with the aid of which mask 6 can be arranged and aligned on substrate 3.

The mask-positioning device 5 features a large number of electromagnets 7, which are arranged peripherally around a holding plate or frame 8. The holding frame 8 is, in turn, connected via a vacuum-tight guide 19 to different drives 12, 13, 14 and 16 that facilitate movement of the holding plate or frame 8 relative to the substrate carrier 2 or the substrate 3. In this regard, movement is permitted by the horizontal drive 12 in the horizontal direction, by the vertical drive 16 in the vertical direction, i.e. out of the plane of the diagram, and by the axial drive 13 in the axial direction, i.e. in the direction of the axis 15. Additionally, a rotary drive 14 is provided, which permits rotation of the holding plate 8 about the axis 15. On account of the drives 12, 13, 14 and 16, the holding plate 8 can thus be brought into any position relative to the substrate carrier 2.

Apart from the mask-positioning device 5, a second movement device is provided in the form of preferably several, and, in the example embodiment, a total of 4, lifting devices 18 arranged in a square for gripping the corners of the rectangular substrate carrier. The ends of the lifting devices 18 each have coupling elements 11 which interact with the substrate carrier couplings 10 such that the substrate carrier 2 can be connected with the lifting devices 18 such that these can move the substrate carrier 2.

The lifting mechanism or drive 18 may comprise a hydraulic or pneumatic lifting cylinder or, as in the preferred embodiment, also a spindle drive, which is characterised by particularly uniform, exact and smooth movement. The axial drive 13 or the other drives may be formed in the same manner.

Apart from the lifting drives 18 and the mask-positioning device 5, additionally provided on the mounting plate 1 are CCD cameras 17, preferably at least two cameras, which can monitor the positioning of the mask 6 on the substrate 3 each via a window element. The CCD cameras form a monitoring unit, which checks the exact positioning of the mask relative to the substrate. In the event of mispositioning, a control unit (not shown) is activated, which controls the movement of the mask-positioning device 5. By means of the drives 12, 14 and 16, the mask 6 can be positioned exactly, as this facilitates alignment of the holding frame 8 in two mutually perpendicular directions, and a rotation. Additionally, the axial drive 13 facilitates positional adjustment concerning the distance of the mask 6 relative to the substrate 3. Overall, the result is that the mask-positioning device 5 affords the possibility of exact positioning of the mask in three independent spatial directions.

The substrate carrier 2 comprises, peripherally around the area in which the substrate 3 comes to lie, a large number of magnets 4 whose positions correspond with the electromagnets 7. This means that, when adherence to the provided substrate and mask positions is observed, during transfer of the mask to the substrate 3, the electromagnets 7 and the magnets 4 of the substrate carrier 2 are exactly opposite each other or their longitudinal axes are arranged on one axis. The magnets 4 can be both permanent magnets and electromagnets. The magnets 4 are arranged at the rear side of the substrate carrier 2 at a mask-holding frame 9, which in turn is arranged via spacers 20 on the substrate-receiver plate of the substrate carrier 2. The mask-holding frame 9 may in this regard be attached in any suitable manner, especially releasably, to the substrate-holding plate of the substrate carrier 2.

The mask-holding frame 9 can be formed both as an annular frame and a continuous plate. Especially, the mask-holding frame also serves as a magnetic yoke for the magnets 4 arranged on it.

The annular or frame-like arrangement of the magnets 4, 7 around or along the edge of the receiver area for the substrate 3 effects uniform and, for dynamic coating, sufficiently firm holding of the mask 6 with magnetic forces sufficiently large enough for handling the thin, foil-like masks without damaging them.

Figure 2:
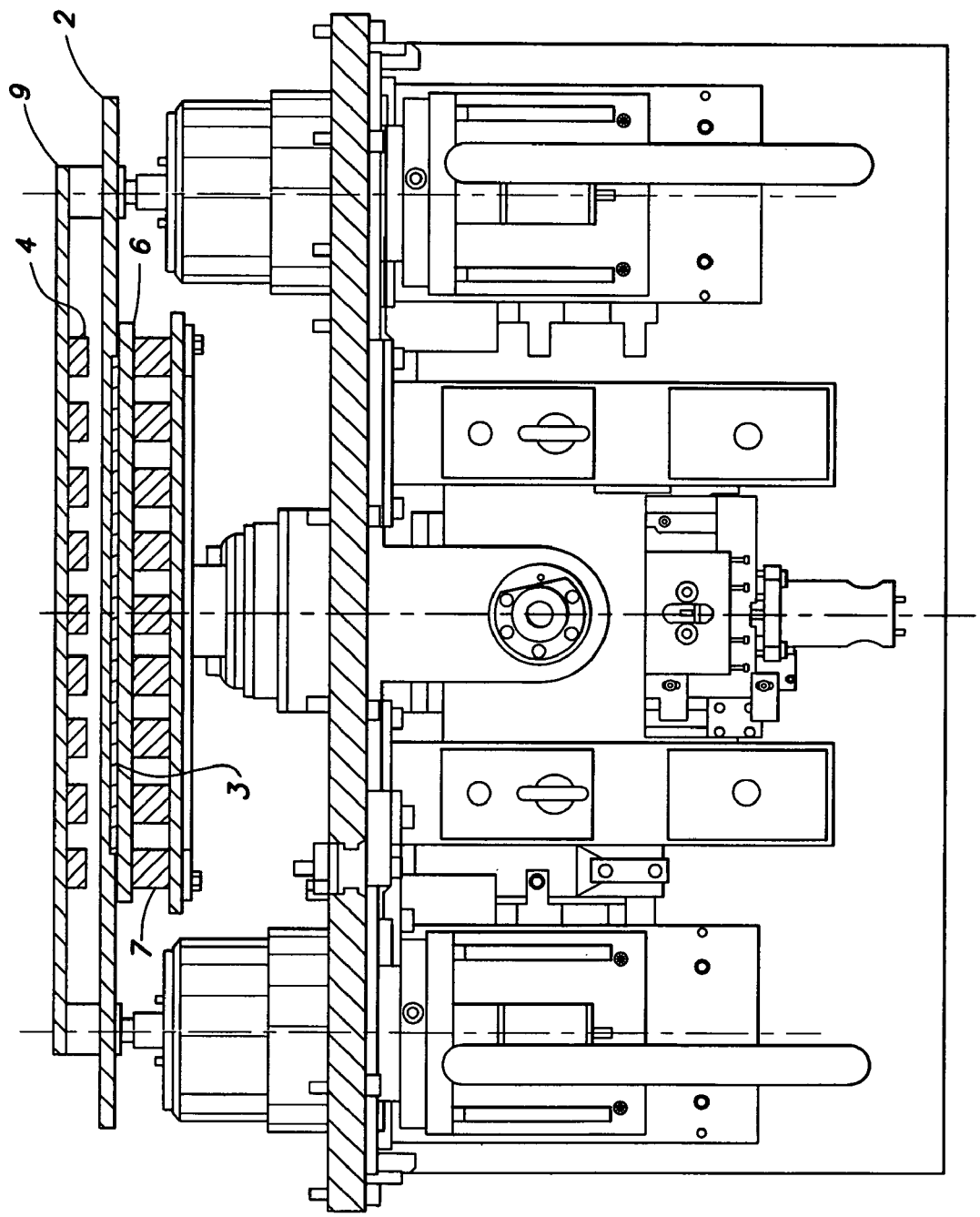
FIG. 2 shows the mask-application station from FIG. 1 with mask arranged at the substrate.
Figure 3:
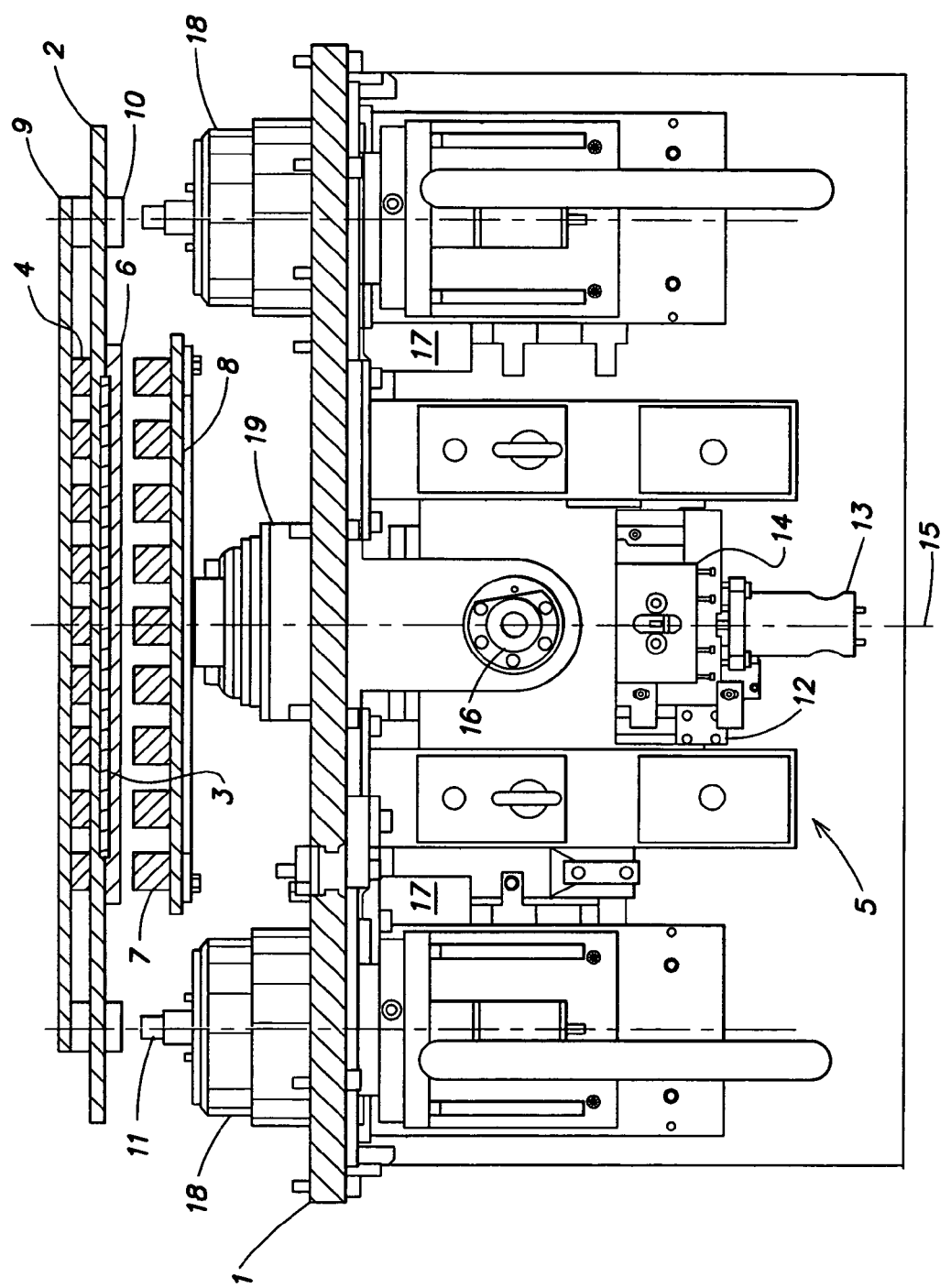
FIG. 3 shows the mask-application station of FIG. 1 and FIG. 2 with the mask deposited on the substrate.

The transfer of the mask to the substrate proceeds as depicted in FIGS. 1 to 3 in such a manner that the mask 6 is first passed by a mask feed to the mask-positioning arrangement 5, said mask 6 featuring a peripheral magnetic frame or edge 21 (see FIG. 4), which corresponds to the peripherally or annularly arranged electromagnets on the holding frame 8 of the mask-positioning device 5, such that mask 6 can be held by its frame 21 or edge by means of the electromagnets 7 of the holding plate 8 on corresponding activation of the electromagnets 7.

As soon as the substrate 3, on which the mask 6 is to be arranged, is arranged in a correspondingly pre-defined position relative to the mask-positioning device 5, exact lateral alignment of the mask 6 relative to substrate 3, i.e. alignment in relation to the x/y coordinates, is adjusted via the drives 12, 14 and 16 with the aid of the CCD cameras 17.

When the mask 6 is aligned in the correct position above the substrate 3, i.e. full register or congruence identity is achieved in the projection, the substrate carrier 2 with the substrate 3 is gripped by the coupling elements 11 of the lifting devices 18 at the substrate-carrier coupling 10 and, as illustrated in FIG. 2, is traversed by means of the lifting devices 18 to the mask 6 from behind such that the magnetic frame or edge of the mask 6 comes to lie over the magnets 4 of the substrate carrier, and the mask 6 comes to lie over the substrate 3. Additionally or alternatively, the movement can be effected perpendicularly to the substrate or mask plane by axial drive 13 as well.

Thereafter, the electromagnets 7 are deactivated or switched off and the substrate 3 is traversed upwards by means of the lifting drives 18.

The substrate 3 with the mask 6 is then ready for further transport through the vacuum-coating machine, with the magnets 4 of the substrate carrier 2 holding the mask 6 on the substrate 3 held by the frame 21 or the edge.

Figure 4:
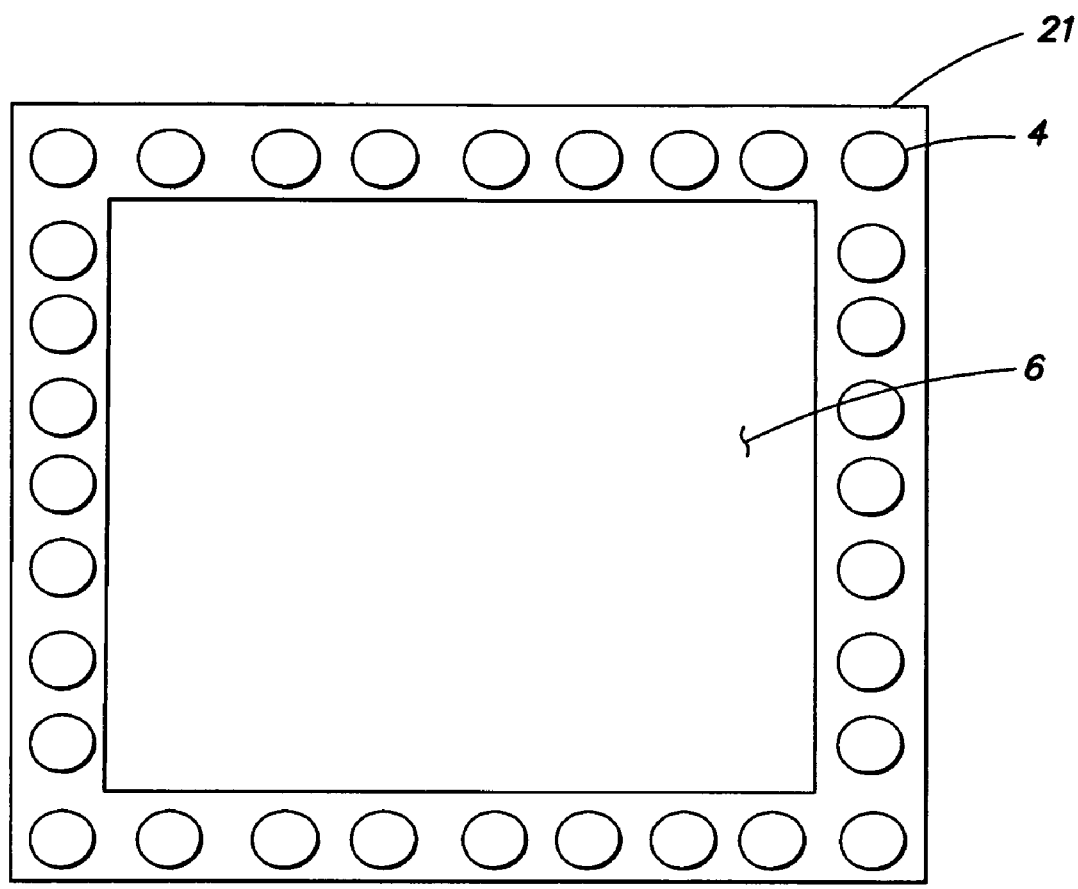
FIG. 4 shows a plan view of a mask with frame.

This is particularly clear in the plan view of FIG. 4, which shows the mask 6 and the frame or edge 21 of the mask 6 and the magnets 4, which are located beneath the frame or the edge 21 on the substrate carrier 2 arranged there under (not shown). The chosen arrangement of the mask holder via magnets 4 at the substrate carrier, especially in an annular or frame-shaped arrangement around or along the edge of the substrate and the corresponding provision of a frame or edge on the mask for interaction with the magnets, facilitates simple handling of the mask, secure holding of the mask against the substrate or substrate carrier during dynamic coating and a major reduction of the particles generated during handling of the mask, i.e. raising and lowering of the mask. Further, inexpensive design and construction of the entire system is facilitated.

Through the use of electromagnets for raising and lowering or holding the mask by its frame or edge in the positioning device, simple transfer is guaranteed, with particularly uniform and smooth movement and transfer obtainable, especially when a spindle drive is used for vertical adjustment of the positioning device and/or the lifting devices for the substrate carrier. The mask 6 and the frame 21 can be formed both as one piece and several pieces, with the multi-piece designs being described as a frame, and the one-piece designs being described as an edge.

Although arrangement of the mask on the substrate only is described here, removal of the mask from the substrate is naturally possible in the reverse manner with the same device. The alignment of the mask merely needs to be eschewed.

LISTS OF TERMS

| | |
|---|---|
| 1 | Chamber wall |
| 2 | Substrate carrier |
| 3 | Substrate |
| 4 | Magnets |
| 5 | Mask-positioning device |
| 6 | Mask |
| 7 | Electromagnets |
| 8 | Holding plate or frame |
| 9 | Mask-holding frame |
| 10 | Substrate-carrier coupling |

-continued

| | |
|---|---|
| 11 | Gripping device |
| 12 | Horizontal drive |
| 13 | Axial drive |
| 14 | Rotary drive |
| 15 | Positioning axis |
| 16 | Vertical drive |
| 17 | Camera |
| 18 | Lifting device |
| 19 | Guide |
| 20 | Spacer |
| 21 | Mask frame |

Having thus described several aspects of at least one embodiment of this invention, it is to be appreciated various alterations, modifications, and improvements will readily occur to those skilled in the art. Such alterations, modifications and improvements are intended to be part of this disclosure, and are intended to be within the spirit and scope of the invention. Accordingly, the foregoing description and drawings are by way of example only.

What is claimed is:

1. A mask holder for a mask for a large-surface substrate, the mask having a magnetic frame or edge, the mask holder comprising:

a substrate carrier for receiving the substrate during a coating process, the substrate carrier comprising a substrate holding plate having a substrate-receiver area on one side and a rear side on another side, wherein the substrate carrier is constructed and arranged to be moved during the coating process together with the mask and the substrate, and wherein the substrate carrier further comprises a plurality of magnets which are directly arranged on the substrate carrier at the rear side of said substrate carrier opposite the substrate-receiver area, via a mask holding frame or a mask holding plate arranged detachably on the substrate holding plate such that the magnets are fixed between the rear side of the substrate holding plate of the substrate carrier and the mask holding frame or the mask holding plate, the magnets being spaced apart from each other peripherally around, or along a portion of an edge of, the substrate-receiver area of the substrate carrier in an annular or frame-like arrangement, and wherein the substrate carrier is constructed and arranged such that the frame or the edge of the mask may be held by the magnets of the substrate carrier, and wherein the substrate carrier with the substrate and the mask is in motion during deposition within a coating chamber, wherein the substrate carrier is constructed and arranged to position the substrate between the mask and the substrate carrier.

2. The mask holder of claim 1, wherein the magnets are one of permanent magnets and electromagnets.

3. The mask holder of claim 1, wherein the magnets are spaced equidistantly from each other peripherally or along an edge of the substrate-receiver area of the substrate carrier.

4. The mask holder of claim 1, further comprising the mask, and wherein the frame and the mask are formed in one pieces so as to form an edge of the mask.

5. The mask holder of claim 1, wherein the mask-holding frame is detachably arranged using spacers.

6. Mask holder of claim 1, wherein the frame and substrate carrier are constructed and arranged to allow one side surface of the mask to fully contact the substrate.

7. The mask holder of claim 1, further comprising the mask and wherein an inner perimeter of the frame fully encompasses the mask.

8. The mask holder of claim 1, further comprising the mask, and wherein an inner perimeter of the frame is one of annular or polygonal.

9. The mask holder of claim 1, wherein the plurality of magnets are constructed and arranged to provide for full-surface pressing of the mask against the substrate.

10. The mask holder of claim 1, in combination with a vacuum-coating machine that receives the substrates and masks and coats the substrates with electroluminescent materials.

* * * * *